United States Patent [19]

Folkmann

[11] 4,426,630

[45] Jan. 17, 1984

[54] ELECTRONICALLY TUNABLE BAND REJECT FILTER

[75] Inventor: Andrew F. Folkmann, Cedar Rapids, Iowa

[73] Assignee: Rockwell International Corporation, El Segundo, Calif.

[21] Appl. No.: 334,957

[22] Filed: Dec. 28, 1981

[51] Int. Cl.³ .................. H03H 7/12; H03H 11/04; H01P 1/20
[52] U.S. Cl. .................. 333/174; 333/17 R; 333/110; 333/176; 333/202
[58] Field of Search .................. 333/167–168, 333/174, 176, 1, 1.1, 2–5, 17 R, 100, 101, 109–112, 114–123, 245, 248, 202, 204–209; 328/167; 331/37, 40, 43; 455/305–307

[56] References Cited

U.S. PATENT DOCUMENTS

| | | | |
|---|---|---|---|
| 2,492,218 | 12/1949 | Guanella | 331/43 |
| 2,942,209 | 6/1960 | Cohn | 333/110 |
| 3,234,555 | 2/1966 | Petrilla et al. | 333/110 X |
| 4,121,182 | 10/1978 | Makimoto et al. | 333/116 X |
| 4,302,738 | 11/1981 | Cabot et al. | 333/17 R X |

FOREIGN PATENT DOCUMENTS 1562942  3/1980  United Kingdom ................ 333/202

OTHER PUBLICATIONS

Liao–"Microwave Devices and Circuits", Prentice-Hall, Englewood Cliffs, N.J., Title Page and pp. 154-156.

Primary Examiner—Marvin L. Nussbaum
Attorney, Agent, or Firm—Richard K. Robinson; Howard R. Greenberg; H. Fredrick Hamann

[57] ABSTRACT

An electronically tunable band reject filter rejects only frequencies of a signal that are in the reject band around its center frequency. The band reject filter includes an input directional coupler for sampling of the signal that is to be filtered and provides a first and second signal thereby. The first signal is filtered by a bandpass filter that passes only frequencies of the signal that are around the center frequency of the bandpass filter. An output directional coupler combines the second signal with the filtered signal and obtains on a difference port the difference between the second signal and the filtered signal. The frequencies of the signal that are centered around the center frequency of the bandpass filter are thereby rejected.

12 Claims, 8 Drawing Figures

ELECTRONICALLY TUNABLE BAND REJECT FILTER

BACKGROUND OF THE INVENTION

This invention relates to band reject filters, and in particular, to an electronically tunable band reject filter that operates in the Radio Frequency (rf) range.

A conventional tunable band reject filter, and in particular, a three-stage band reject or notch filter that is used in the prior art includes three series tuned shunt tank circuits that are separated by a transmission line that is approximately one-quarter wave length at the mid-band of frequency to which the filter is designed to operate. Very high tank Q's, the quality of merit of filters and tuned circuits, are required to obtain a high level of attentuation at the center frequency, particularly if linear phase shift response is required to within a few percent of the notch frequency.

An electronically tuned band reject filter may be constructed by using varactor diodes. Unfortunately, varactors do not have the extremely high Q of the air dielectric capacitors that they replaced. The reduced tank Q may not be acceptable, especially in applications where phase response is an important parameter.

The varactor tuned band reject filter is also limited to low power levels. At the notch, or center frequency, the resonant tanks present a very low impedance to the signal that is to be filtered. Since nearly all the incident power is reflected back to the signal source by the first pole, the voltage across the varactor in that pole is equal to the incident voltage times the Q of the tank. The peak swing across a varactor diode must be limited to several volts; consequently, the incident voltage must be on the order of ten millivolts or less.

One of the major disadvantages of the prior art band reject filter is that it reflects incidental power back to the load; hence, it has an infinite Voltage Standing Wave Ratio (VSWR) at the center frequency.

SUMMARY OF THE INVENTION

An electronically tunable band reject filter rejects only frequencies of a signal that are in the reject band around its center frequency. The band reject filter includes an input directional coupler for sampling the signal that is to be filtered and provides a first and second signal thereby. The first signal is filtered by a bandpass filter that passes only frequencies of the signal that are around the center frequency of the bandpass filter. An output directional coupler combines the second signal with the filtered signal and obtains on a difference port the difference between the second signal and the filtered signal. The frequencies of the signal that are centered around the center frequency of the bandpass filter are thereby rejected.

There are additional embodiments of the invention provided for compensating the nonlinearity of the directional couplers in both amplitude and phase differences as well as an embodiment for providing an electronically tunable notched filter.

It is the object of this invention to provide a band reject filter that does not require high tank Q's to achieve a deep notch or high rejection.

It is another objective of the invention to provide an electronically tunable band reject filter in which the phase shift through the filter remains linear nearer to the center frequency than the prior art band reject filters.

It is yet another objective of the invention to provide a band reject filter in which the phase shift through the band reject filter is dependent upon the amplitude bandwidth of the bandpass filter and not on a phase shift response.

It is yet another objective of the invention to provide a band reject filter that has an advantage of presenting a low VSWR load to the source to which the filter is connected at the band reject frequency.

These and other objectives, features and advantages of the present invention will appear more fully from the following description of the preferred embodiments taken in conjunction with the drawings.

DETAILED DESCRIPTION OF THE FIGURES

DETAILED DESCRIPTION OF THE PREFERRED EMBODIMENT

Figure 1:
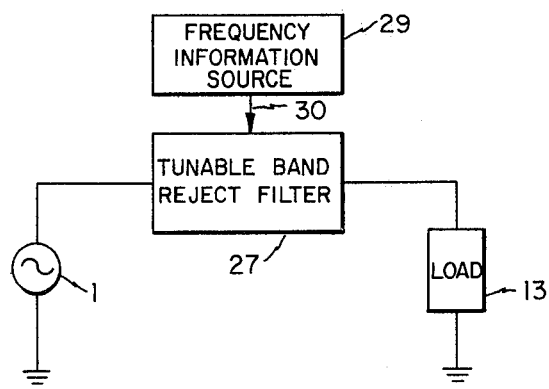
FIG. 1 is a block diagram of a circuit with a band reject filter according to the invention.

In FIG. 1, to which reference should now be made, there is shown an electronically tunable band reject filter 27 that is connected to a signal source 1 which in the preferred embodiment is a radio frequency signal source which provides a radio frequency signal to a load 13 via the electronically tunable filter 27. The center frequency of the electronically tunable band reject filter 27 is provided by a frequency information source 29 via a conductor 30 which selects the frequency to which the band reject filter will offer a high attenuation.

Figure 2:
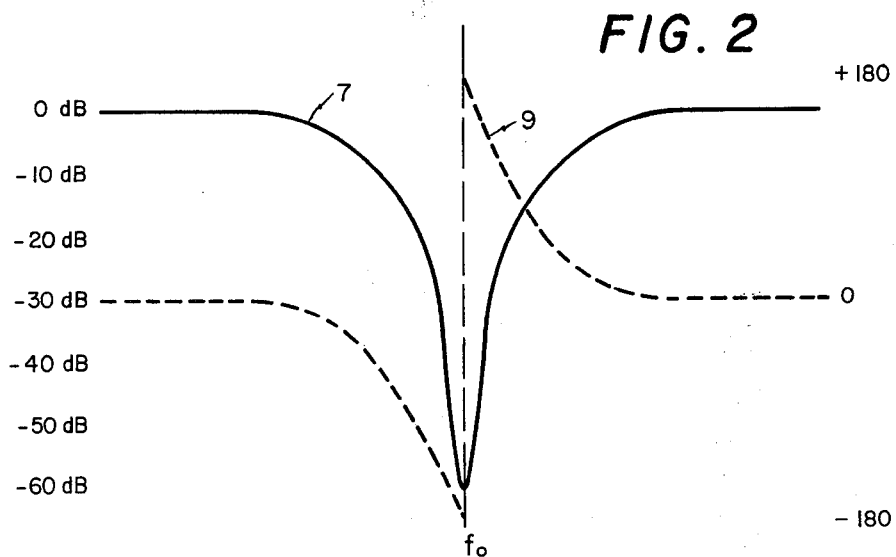
FIG. 2 is a plot of the phase and amplitude response of the band reject filter according to the invention.

FIG. 2, to which reference should now be made, illustrates in graphical form the frequency and phase response of the tunable band reject filter 27 in which curve 7 is the amplitude response of the band reject filter 27 and illustrates at the center frequency $f_o$ that the electronically tunable band reject filter has greater than 60 dB attenuation. The phase response, the angles of which are represented on the right hand side of the graph and represented by curve 9, illustrates that at $f_o$ there is a 180° phase shift in the output frequency as compared to the input frequency. The slope of curve 7 illustrates why band reject filters are sometimes referred to as "notch" filters.

Figure 3:
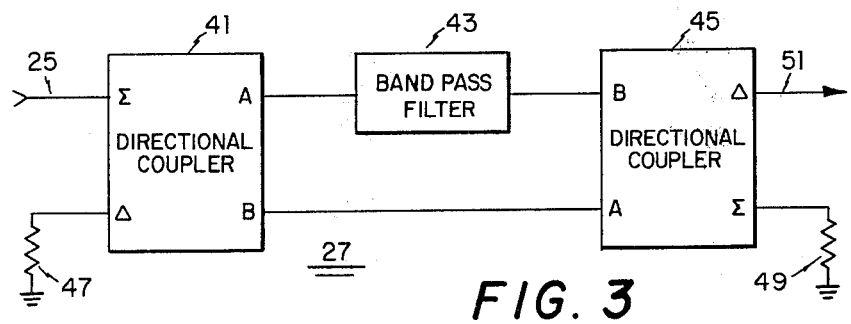
FIG. 3 is a block diagram of a band reject filter used in the circuit of FIG. 1.

In FIG. 3 there are shown two directional couplers 41 and 45 and a bandpass filter 43, which, when connected as shown in FIG. 3, achieve the frequency response characteristic of a band reject filter. The bandpass filter 43, in the embodiment of FIG. 3, is a fixed bandpass filter and consequently the band reject filter in which it is included has a fixed center frequency. However, the bandpass filter 43 may be a tunable bandpass filter such as the mechanically tunable bandpass filter 43 of FIG. 4 or the electronically tunable bandpass filter 43 of FIG. 6. In the preferred embodiment, the directional couplers 41 and 45, are equal split (3 dB) directional couplers and the bandpass filter 43 in the ideal case is lossless with no insertion phase shift at $f_o$, the center frequency of the bandpass filter 43. Signals that are applied to terminal 25 with frequencies in the bandwidth around the center frequency, $f_o$, are supplied in sampled form by the directional coupler 41 and recombined in the directional coupler 45. The combination appears at the summation port, $\Sigma$, of the directional coupler 45. For the frequencies outside the bandpass of the bandpass filter 43 only that portion of the signal that is conducted from terminal B of the directional coupler 41 to terminal A of the directional coupler 45 reaches the output terminals of the directional coupler 45 and is split equally between the $\Sigma$ and the $\Delta$ terminals of the directional coupler 45. Resistors 47 and 49 are termination resistors and are matched to the characteristic impedance of the directional couplers 41 and 45 respectively. The resultant frequency response of the network has a low, $\simeq 6.0$ dB, insertion loss at all frequencies outside the passband of the tunable bandpass filter 43, and a deep notch at the center frequency. The relative coupling between the A and B port of the directional couplers 41 and 45 may be of any ratio and need not be restricted to the 3 dB case as shown in the embodiment of FIG. 3.

The phase shift that is introduced by the bandpass filter 43 may be compensated for by using nonidentical directional couplers; and, thus, the directional coupler 41 may be different from directional coupler 45 such that the phase shift that is introduced by the bandpass filter 43 is compensated for. In the case where 3 dB directional couplers are used, phase shifts in multiples of 90° can be corrected for by using a 90° directional coupler for the directional coupler 41 and an in-phase/180° directional coupler for the directional coupler 45. Alternatively and as will be discussed later, phase error of the bandpass filter 43 may be corrected by slightly detuning one or more of the poles of the bandpass filter 43.

Figure 4:
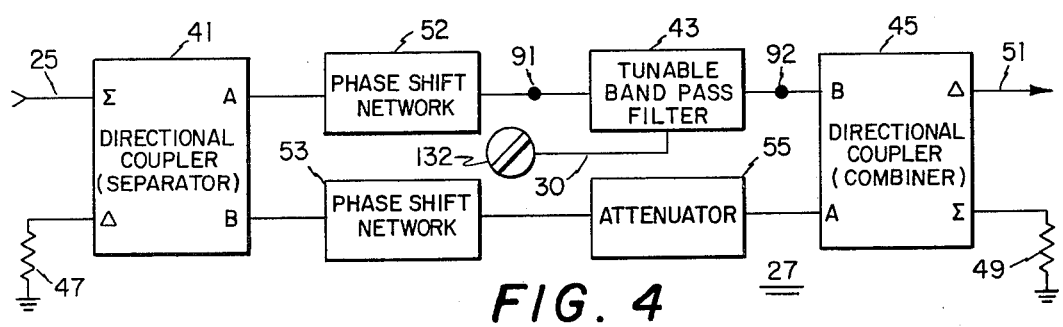
FIG. 4 is an embodiment of a tunable band reject filter.

The insertion loss of the bandpass filter 43 can easily be accommodated. This embodiment is shown in FIG. 4, to which reference should now be made. An attenuator 55 in the lower signal path is connected between the B terminal of the directional coupler 41 and the A terminal of the directional coupler 45, and compensates for the insertion loss attributed to the bandpass filter 43. An alternative phase shift conpensation is provided by phase shift networks 52 and 53 that compensate for the phase shift that is introduced by the bandpass filter 43. The bandpass filter 43, in the embodiment of FIG. 4, is a mechanically tunable bandpass filter 43 and, consequently, the band reject filter in which it is included has a tunable center frequency which may be tuned by rotating tuning knob 132 which causes the drive shaft 30 to rotate varying the reactance of a tuned circuit to which the drive shaft 30 is connected. However, the bandpass filter 43 may be an electronically tunable bandpass filter such as the electronically tunable bandpass filter 43 of FIG. 6 or the fixed tuned bandpass filter 43 of FIG. 3.

Figure 5:
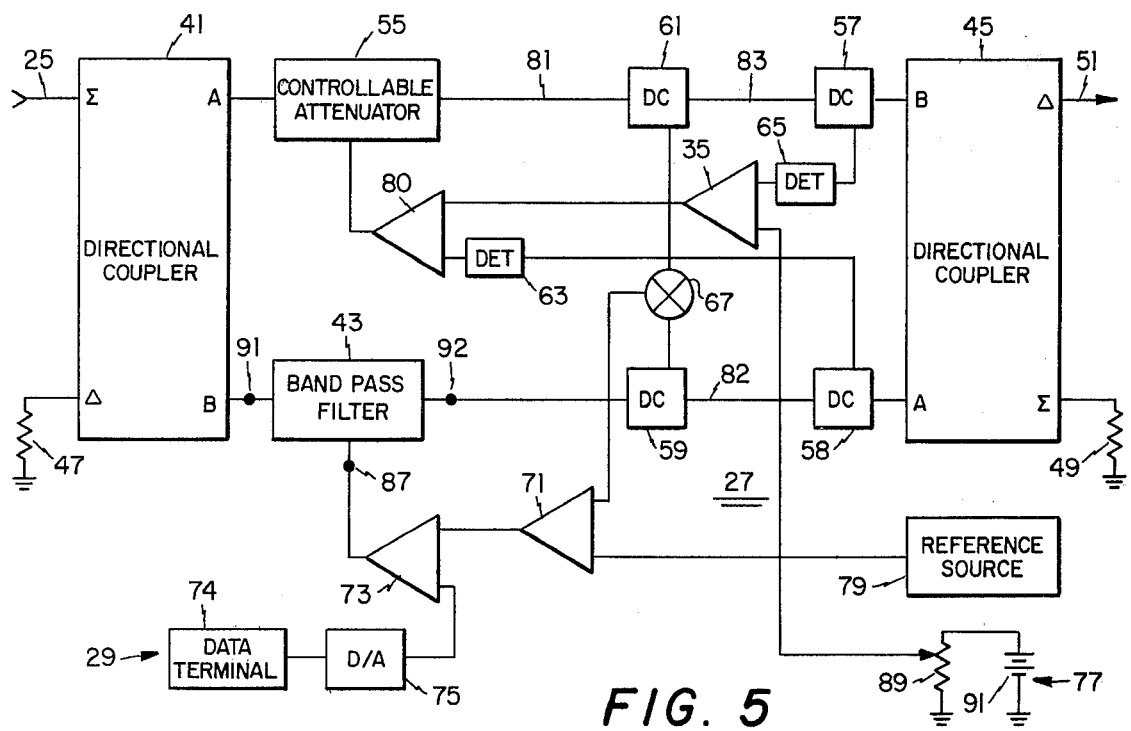
FIG. 5 is yet another embodiment of the tunable band reject filter.

In the preferred embodiment a deep null at the $\Delta$ port of the directional coupler 45 is obtainable only when there is an accurate phase and amplitude balance of the signals that are applied to the A and B terminals of the directional coupler 45. An ideal directional coupler has infinite directivity and no coupling variations across the band of frequencies to which the tunable band reject filter 27 is operated. The signals that are applied to the A and B terminals of the directional coupler 45 must be within 0.09 dB amplitude and 0.5° phase balance to obtain a 40 dB null or notch. Since the phase and amplitude imbalance of directional couplers may be an order of magnitude greater than these limits, additional control circuits in the preferred embodiment are utilized to maintain a high degree of cancellation over the entire bandwidth. In the embodiment of FIG. 5, a band reject filter with 50 dB of cancellation tunable over an octave bandwidth is illustrated. A balance in the amplitude of the signal that is applied to terminal B of the directional coupler 45 is maintained with the signal that is applied to terminal A of directional coupler 45, by an amplitude balancing circuit that partially includes a voltage sensor (Directional Coupler) DC 57 and a voltage sensor 58. The voltage that is sensed by the voltage sensor (Directional Coupler) DC 57 is applied to a detector 65 and the voltage that is sensed by the voltage sensor (Directional Coupler) DC 58 is applied to a detector 63. Variable gain amplifier 35 is nominally a unity gain amplifier. The gain of variable gain amplifier 35 can be varied slightly, however, under the control of reference source 77 to compensate for differences in the sensitivity of detectors 63 and 65 and for variation in coupling between the A and B ports of coupler 45. The reference source 77 is illustrated as a voltage source 91 and a variable resistor 89. The difference amplifier 80 obtains the difference in amplitude of the amplified detected voltage provided by the variable gain amplifier 35 with the detected voltage from the detector 63 to obtain a control signal that is used to control a controllable attenuator 55. The controllable attenuator 55 adjusts the amplitude of the signal on conductor 81 to correct for any voltage imbalances indicated by the difference signal from the difference amplifier 80.

Phase balance is obtained through a balancing circuit that includes a mixer 67, two phase sensors (Directional Couplers) DC 59 and 61, and a difference amplifier 71. The phase sensor (Directional Couplers) DC 59 and 61 pick up samples of the voltages that are on conductors 82 and 83. The sample of these voltages are applied to a phase detector which in the preferred embodiment is a mixer 67 with the resulting mixed signal being applied to the difference amplifier 71. The difference amplifier 71 obtains the difference between the mixed signal and a reference signal that is provided by a reference source 79 and the difference is used to control the bandpass filter 43. In the preferred embodiment, the adjustment of the reference source 79, which is a variable dc source, is used to adjust or fine tune one of the poles of the bandpass filter 43 when it is a multiple pole filter, or the single pole if the bandpass filter is a single pole filter. The output from the difference amplifier 71 is applied to a second difference amplifier 73 which has a reference source from a voltage source such as a data terminal 74 and a D/A converter 75 that generates a reference voltage for comparison with the output of the difference amplifier 71. The difference is applied to the bandpass filter 43 via terminal 87. In the case where the bandpass filter 43 is a single pole filter, then both the phase adjustment and tuning of the central frequency $f_o$ is controlled by the voltage that is applied to the terminal 87 via the difference amplifier 73. Although the reference sources 29, 77 and 79 are shown as being different versions of adjustable voltage sources, in the preferred embodiment the reference sources are all three the embodiment of the reference source 29.

Figure 6:
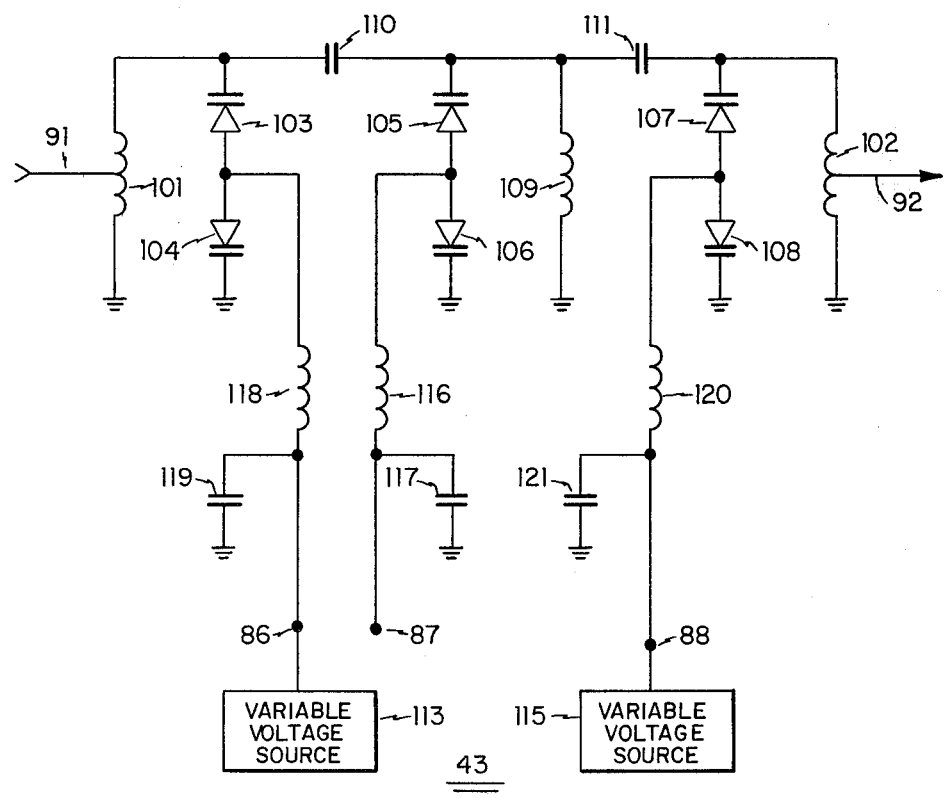
FIG. 6 is a circuit diagram of a tunable bandpass filter according to the invention.

FIG. 6 is a three-pole bandpass filter 43 that is electronically tunable and can be used as the tunable bandpass filter 43 of FIG. 5. In addition to the adjustment that is made to the voltage terminal 87, coarse tuning is provided by the variable voltage sources 113 and 115. The three-pole filter consists of an input transformer 101 which couples the RF signal from terminal 91 to the varactor pair that includes varactors 103 and 104. The voltage source 113 sets the reactance of the varactor pair 103 and 104 by applying a voltage to the two varactors via the RF blocking coil 118. Low pass filtering is provided by capacitor 119. The second stage of the filter is connected to the first stage by capacitor 110 and includes a varactor pair that includes varactors 105 and 106. Terminal 87 is connected to the junction of the two varactors 105 and 106 by the RF blocking inductor 116 and capacitor 117, and provides a low pass filter to the signal that is present at terminal 87. The three stages of the filters are matched; so, consequently, there is an inductor 109 which is part of the tank circuit which includes the two varactors 105 and 106. The third stage is coupled to the second stage via capacitor 111 and includes the output transformer 102 and the two varactors 107 and 108. There is an RF blocking inductor 120 and a low frequency filtering capacitor 121 which passes the DC tuning voltage from the variable voltage source 115 to varactors 107 and 108, but prevents the RF signal present on the varactors from reaching the variable voltage source 115.

Figure 7:
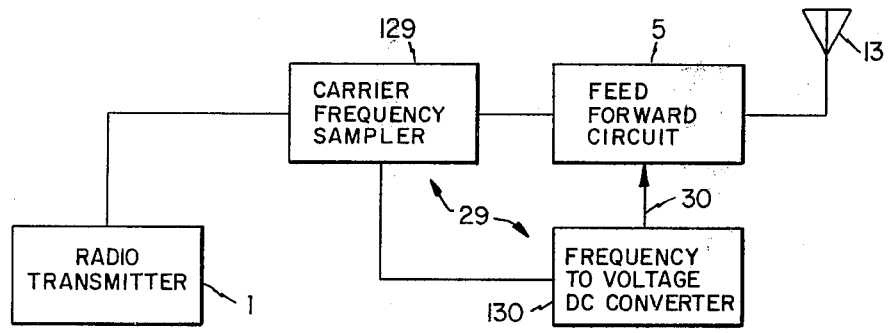
FIG. 7 is a block diagram of an automatically tunable bandpass filter incorporating the band reject filter of the invention.

There are applications where a feed forward circuit 5 such as that disclosed in my copending application entitled, "A Feed Forward Circuit", Ser. No. 334,859 filed on Dec. 28, 1981, and assigned to the Assignee of the present invention is inserted between a transmitter and an antenna. The frequency information required for the electronically tunable band reject filter incorporated in the feed forward circuit may be derived directly from the input signal as shown in FIG. 7 to which reference should now be made. A radio transmitter 1 is the signal source that provides a signal to the feed forward circuit 5 and the antenna 13. The frequency information source 29 consists of a carrier frequency sampler 129 which samples the carrier frequency provided by the radio transmitter 1 and passes the sample to a frequency-to-voltage converter 130. The frequency-to-voltage converter 130 converts the sample into a signal to which the electronically tunable band reject filter 27 will respond.

Figure 8:
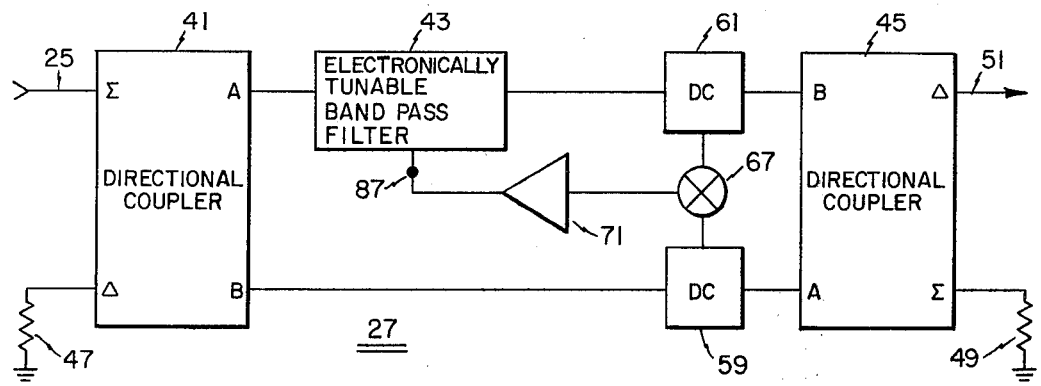
FIG. 8 is a block diagram of an automatically tunable band reject filter.

A self tuning band reject filter is illustrated in FIG. 8 in which the tuning voltage is generated within the tunable band reject filter 27. The radio frequency signal is provided from signal source 1 via terminal 25 of the directional coupler 41 which splits the sampled signal on terminal 25 into two signals, one of which is present on terminal A and the other is present on terminal B. The signal that is present on terminal A is passed through the electronically tunable bandpass filter 43 and the directional coupler 61 to terminal B of the directional coupler 45. The signal that is present on terminal B of the directional coupler 41 is connected to terminal A of the directional coupler 45 via the directional coupler 59. The directional couplers 59 and 61 sample the signals that are present on terminal A and terminal B of the directional coupler 45, respectively. The sampled signals are mixed by the mixer 67 which detects the phase difference between the signals on terminals A and B of the directional coupler 45. Amplifier 71 amplifies the detected phase signal and applies it to terminal 87 of the electronically tunable bandpass filter 43 which selects, based upon the amplified phase detect signal, the center frequency, $f_o$, of the electronically tunable bandpass filter 43.

Many changes and modifications in the above described embodiment of the invention can, of course, be carried out without departing from the scope thereof. Accordingly, the scope is intended to be limited only by the scope of the appended claims.

I claim:

1. A band reject filter comprising:
   a first directional coupler means for sampling an input signal to obtain a first sampled signal and a second sampled signal;
   bandpass filter means having a center frequency and coupled to receive said first sampled signal and provide a filtered first sampled signal having only frequencies in a bandwidth about said center frequency, said bandpass filter means including means responsive to a control signal for varying the center frequency of said bandpass filter means;
   a second directional coupler means coupled to provide an output of the difference between the filtered first sampled signal and the second sampled signal as a band reject filter output;
   first sensor means for sensing said filtered first sampled signal to obtain a first sensed signal;
   second sensor means for sensing the second sampled signal to obtain a second sensed signal; and
   means responsive to said first sensed signal and said second sensed signal for providing an output, said output being coupled as the control signal to said bandpass filter means for varying the center frequency.

2. The band reject filter of claim 1 wherein said means responsive to said first and second sensed signals comprises mixer means for mixing said first sensed signal with said second sensed signal to provide a mixed signal, means for providing a reference signal, and means for comparing the reference signal with said mixed signal to obtain a difference signal which is coupled to provide the control signal to said bandpass filter means for varying the center frequency.

3. The band reject filter of claim 2 wherein said means for comparing comprises a first comparator coupled to receive said reference signal and said mixed signal and provide a first difference signal, means for providing a variable reference signal, and a second comparator coupled to receive said variable reference signal and said first difference signal and provide a second difference signal, said second difference signal being coupled as said control signal to said bandpass filter means for varying the center frequency.

4. The band reject filter of claim 3 further comprising means for compensating for amplitude variations between the filtered first sampled signal and said second sampled signal.

5. The band reject filter of claim 4 wherein said means for compensating comprises:
   first detector means for detecting the filtered first sampled signal to obtain a first detected signal;
   second detector means for detecting the second sampled signal to obtain a second detected signal;
   means for providing a second reference signal;
   variable gain amplifier means for controlling the amplitude of said second detected signal in response to said second reference signal to provide a controlled detected signal;

difference means for providing an output of the difference between said first detected signal and the controlled detected signal; and attenuator means responsive to said difference output from said difference means for attenuating the amplitude of said second sampled signal.

6. A method of rejecting frequencies in a selected reject band comprising:

providing an input signal;

sampling said input signal to obtain a first sampled signal and a second sampled signal;

filtering said first sampled signal to provide a filtered first sampled signal of frequencies in a bandwidth about a center frequency;

providing an output of the difference between the filtered first sampled signal and the second sampled signal as the reject band output;

sensing the filtered first sampled signal to obtain a first sensed signal;

sensing the second sampled signal to obtain a second sensed signal; and combining the first sensed signal and the second sensed signal to obtain a control signal; and changing the center frequency of the filtering in response to said control signal.

7. The method of claim 6 wherein said step of combining comprises providing a first reference signal, mixing the first sensed signal and the second sensed signal to produce a mixed signal, and comparing said first reference signal to said mixed signal to provide a difference signal as the control signal for controlling the variation of said center frequency.

8. The method of claim 7 wherein said step of comparing comprises comparing said first reference signal with said mixed signal to obtain a first difference signal, providing a variable reference signal, and comparing the variable reference signal with said first difference signal to provide a second difference signal as the control signal for varying the center frequency.

9. The method of claim 8 further comprising the step of compensating for amplitude variations between the filtered first sampled signal and the second sampled signal.

10. The method of claim 9 wherein the step of compensating for amplitude variations comprises:

detecting the filtered first sampled signal to obtain a first detected signal;

detecting the second sampled signal to obtain a second detected signal;

providing a second reference signal;

controlling the amplitude of the second detected signal in response to said second reference signal to obtain a controlled detected signal;

obtaining the difference between the first detected signal and the controlled detected signal to provide an adjusting signal; and attenuating the amplitude of the second sampled signal in response to said adjusting signal.

11. A band reject filter comprising:

a first directional coupler means for sampling an input signal and providing an output of a first sampled signal and a second sampled signal;

bandpass filter means having a center frequency and coupled to receive said first sampled signal and provide a filtered sampled signal having only frequencies of said first sampled signal in a bandwidth about the center frequency;

a second directional coupler means coupled to provide an output of the difference between the filtered first sampled signal and the second sampled signal as a band reject filter output; and means for compensating for amplitude variations between the filtered first sampled signal and said second sampled signal comprising first detector means for detecting the first sampled signal and providing a first detected signal, means for providing a reference signal, second detector means for detecting the second sampled signal and providing a second detected signal, variable gain amplifier means coupled to control the amplitude of the second detected signal in response to said reference signal and provide a controlled detected signal, difference means coupled to provide an output of the difference between the first detected signal and the controlled detected signal as an adjusting signal, and means for attenuating the amplitude of the second sampled signal in response to said adjusting signal.

12. A method for rejecting frequencies in a selected reject band comprising:

providing an input signal;

sampling said input signal to obtain a first sampled signal and a second sampled signal;

filtering said first sampled signal to provide a filtered first sampled signal of frequencies in a bandwidth about a center frequency;

providing an output of the difference between the filtered first sampled signal and the second sampled signal as the reject band output; and compensating for amplitude variations between the filtered first sampled signal and the second sampled signal by, detecting the filtered first sampled signal to obtain a first detected signal, detecting the second sampled signal to obtain a second detected signal, providing a reference signal, controlling the amplitude of the second detected signal in response to said reference signal to obtain a controlled detected signal, providing an output of the difference between the first detected signal and the controlled detected signal as an adjusting signal, and attenuating the amplitude of the second sampled signal in response to the adjusting signal.

* * * * *